United States Patent [19]

Sasaki

[11] Patent Number: 5,231,077
[45] Date of Patent: Jul. 27, 1993

[54] ACTIVE DEVICE HAVING AN OXIDE SUPERCONDUCTOR AND A FABRICATION PROCESS THEREOF

[75] Inventor: Nobuo Sasaki, Kawasaki, Japan
[73] Assignee: Nobuo Sasaki, Kanagawa, Japan
[21] Appl. No.: 742,231
[22] Filed: Aug. 8, 1991

[30] Foreign Application Priority Data

Aug. 9, 1990 [JP] Japan .................................. 2-212385

[51] Int. Cl.$^5$ ......................... H01B 12/00; C35C 1/02
[52] U.S. Cl. ...................................... 505/1; 505/701; 505/702; 505/703; 505/729; 505/732; 156/600; 156/603
[58] Field of Search ................ 156/600, 603, DIG. 64; 505/1, 701, 702, 703, 729, 732

[56] References Cited

U.S. PATENT DOCUMENTS

| | | | |
|---|---|---|---|
| 4,970,395 | 11/1990 | Kruse | 505/701 |
| 5,017,551 | 5/1991 | Agostinelli et al. | 505/702 |
| 5,047,390 | 9/1991 | Higashino et al. | 505/702 |

FOREIGN PATENT DOCUMENTS

| | | | |
|---|---|---|---|
| 0269349 | 6/1988 | European Pat. Off. | |
| 294285 | 12/1988 | European Pat. Off. | 505/732 |
| 2-44781 | 2/1990 | Japan | 505/701 |
| 2-212306 | 8/1990 | Japan | 505/729 |

OTHER PUBLICATIONS

Proceedings international Electron Devices Meeting; "Design and Performance of Subicron MOSFETs on Ultra-Thin SOI for Room Temperature and Cryogenic Operation"; Dec. 11, 1988, San Francisco, US pp. 294-295.

IBM Technical Disclosure Bulletin; "Fabrication of Buried Membrane for Superconducting Transistor Device"; vol. 30, No. 3, Aug. 1987, New York, US, pp. 1317-1318.

Journal of Material Research; "Superconductor-Substrate Interactions of the Y-Ba-Cu Oxide"; vol. 4, No. 1, Jan. 1989, London, UK pp. 1-15.

Primary Examiner—Robert Kunemund
Attorney, Agent, or Firm—Armstrong, Westerman, Hattori, McLeland & Naughton

[57] ABSTRACT

A method for fabricating an active device comprises the steps of injecting particles into a single crystal substrate of a semiconductor material at a predetermined depth from the surface, annealing the substrate that contains the particles to form an insulator layer within the substrate, generally in correspondence to the predetermined depth, the step of annealing including a step of forming a single crystal semiconductor layer of a semiconductor material identical in composition with the substrate, on the insulator layer that is formed by the annealing, starting a deposition of a layer of an oxide superconductor on the semiconductor layer, growing the oxide superconductor layer while maintaining an epitaxial relationship with respect to the substrate; and converting the semiconductor layer to an oxide layer simultaneously to the growth of the oxide superconductor layer.

10 Claims, 3 Drawing Sheets

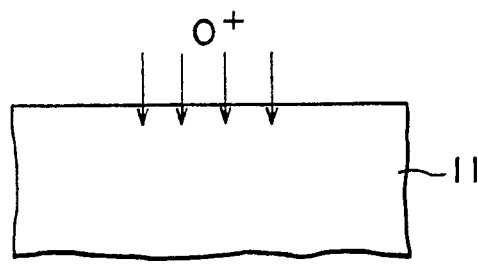
FIG.I (A)
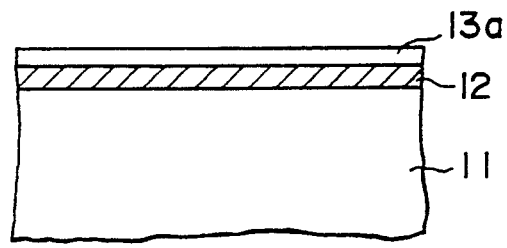
FIG.I (B)
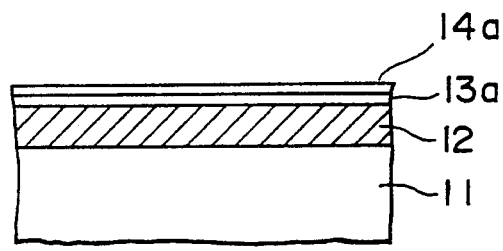
FIG.I (C)
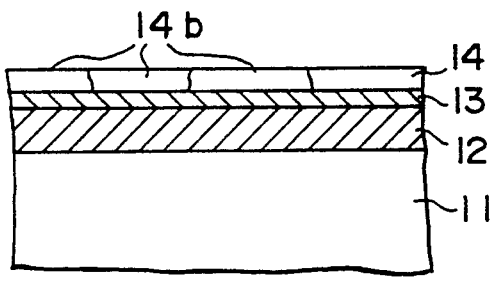
FIG.I (D)

ACTIVE DEVICE HAVING AN OXIDE SUPERCONDUCTOR AND A FABRICATION PROCESS THEREOF

BACKGROUND OF THE INVENTION

The present invention generally relates to active devices, and more particularly to a method of fabricating an active device having a high temperature superconductor layer on an insulating substrate.

In the integrated circuits, a long interconnection strip is used for connecting various devices formed on the integrated circuit. With the increase in the integration density, the length of the interconnection strip is increasing more and more. For example, there is an integrated circuit in which the length of the interconnection reaches as much as 2 cm. As will be easily understood, such a long interconnection strip causes a considerable delay in the signals that are transferred therethrough, and the speed of logic gates is now becoming limited by the delay caused by the interconnection strips rather than the operational speed of the logic device itself. This is particularly conspicuous in the integrated circuits of high speed logic devices such as Josephson devices.

The delay in the signal transfer in the interconnection strip is mainly determined by the parasitic capacitance and the resistance of the strip. Thus, a material that has the low resistance is preferable for the interconnection strip. Conventionally, polysilicon, silicides, tungsten, molybdenum, aluminum, and the like, are used for the interconnection strip, wherein aluminum provides the lowest resistance and is used widely. Even so, the resistance of the interconnection increases with increasing integration density, as such an increase in the integration density inevitably results in the reduced thickness of the aluminum or other conductor strip.

Meanwhile, the discovery of ceramic superconductors that show a relatively high critical temperature has opened a new field in the research of active devices and integrated circuits. With the use of these so-called high temperature superconductors for the interconnection strips, it is expected that one can achieve the zero resistance relatively easily, without cooling the entire device to the liquid helium temperature. There is even an expectation for the discovery of material that causes the transition to the superconducting state at the room temperature. Thereby, the problem of delay in the signal transfer caused by the interconnection strip would be eliminated. Further, such a superconducting interconnection strip of high temperature superconductors would be advantageous for constructing Josephson integrated circuits.

In the integrated circuits, patterned interconnection strips are provided on an oxide film that is formed on the surface of a semiconductor substrate. The oxide film thus formed is generally in the amorphous state, and because of this, there occurs a problem when one deposits a layer of ceramic or oxide-based superconductors on such an amorphous layer. The superconductor layer cannot be formed on the amorphous film as long as conventional sputtering, evaporation-deposition, CVD, or MBE processes are employed. Thus, the material on which the high temperature superconductors can be deposited is generally limited to the single crystals of MgO, $SrTiO_3$, YSZ, Si, or the like. These materials allow the epitaxial growth of the high temperature superconductor layer deposited thereon.

When using the high temperature superconductors in the integrated circuits, however, one encounters another problem that the superconductor layer has to be grown directly on the amorphous, insulating oxide layer. Because of this problem, use of high temperature superconductors for the interconnection strips has been hitherto unsuccessful in the active devices and integrated circuits.

SUMMARY OF THE INVENTION

Accordingly, it is a general object of the present invention to provide a novel and useful process for fabricating an active device, wherein the foregoing problems are eliminated.

Another and more specific object of the present invention is to provide a process for forming a superconducting interconnection pattern on an amorphous oxide layer in direct contact therewith.

Another object of the present invention is to provide a process for fabricating an active device, including a step of forming a superconducting layer in contact with an amorphous oxide layer formed on a surface of a semiconductor substrate.

Another object of the present invention is to provide an active device comprising a semiconductor substrate and an amorphous oxide film provided on the substrate, wherein a layer of high temperature superconductor is provided directly in contact with the amorphous oxide film with a predetermined relationship, in terms of crystallographic orientation, with respect to the semiconductor substrate. According to the present invention, the grain boundary in the high temperature superconductor layer, if any, is minimized because of the epitaxial nature of the superconductor layer, and the electric current flows freely through the superconductor layer even when impurities are segregated at the grain boundary. It should be noted that the electric current can pass freely through the impurities at the grain boundary by tunneling as long as the thickness of the segregated phase is sufficiently thin. In the case when the superconductor layer is formed as a polycrystalline phase, on the other hand, there is a considerable accumulation of segregated phases at the grain boundary, and the path of the current through the grains would be restricted. Thereby, an excessive concentration of current may occur. When this occurs, the critical current may be exceeded locally, and the superconductor causes a transition to the normal conduction state. Thereby, the path of the current through the superconductor layer is further restricted. By using the single crystal superconductor layer as set forth above, one can fully exploit the advantageous feature of zero resistance of the high temperature superconductor layer.

Another object of the present invention is to provide a process for fabricating an active device, comprising the steps of injecting particles into a semiconductor substrate at a predetermined depth from the surface; annealing the substrate thus injected with the particles to form an insulator layer within the substrate generally in correspondence to said predetermined depth, by a chemical reaction between the semiconductor material forming the substrate and the injected particles, such that a layer of a semiconductor material identical with the material of the substrate is formed on the insulator layer thus formed; starting deposition of a layer of oxide superconductor on said semiconductor layer; growing the oxide superconductor layer epitaxially with respect to the semiconductor layer; and converting the semiconductor layer to an oxide layer simultaneously to the growth of the oxide superconductor layer. According to the present invention, one can successfully form an oxide superconductor layer on the underlying oxide layer, by initially growing the oxide superconductor layer epitaxially on the semiconductor layer and then converting the semiconductor layer into oxide. Thereby, one can form a superconducting interconnection layer and active devices directly on the oxide layer. With the use of the high temperature superconductor for the interconnection layer, one can reduce or eliminate the delay in the signal transfer even when the length of the interconnection is increased with the increased integration density. Further, the process of the present invention is suited for forming a Josephson device on the integrated circuit by the high temperature superconductor.

Other objects and further features of the present invention will become apparent from the following detailed description when read in conjunction with the attached drawings.

BRIEF DESCRIPTION OF THE DRAWINGS

FIGS. 1(A)-1(D) are diagrams showing the process for fabricating an active device according to a first embodiment of the present invention;

DETAILED DESCRIPTION

Figure 2:
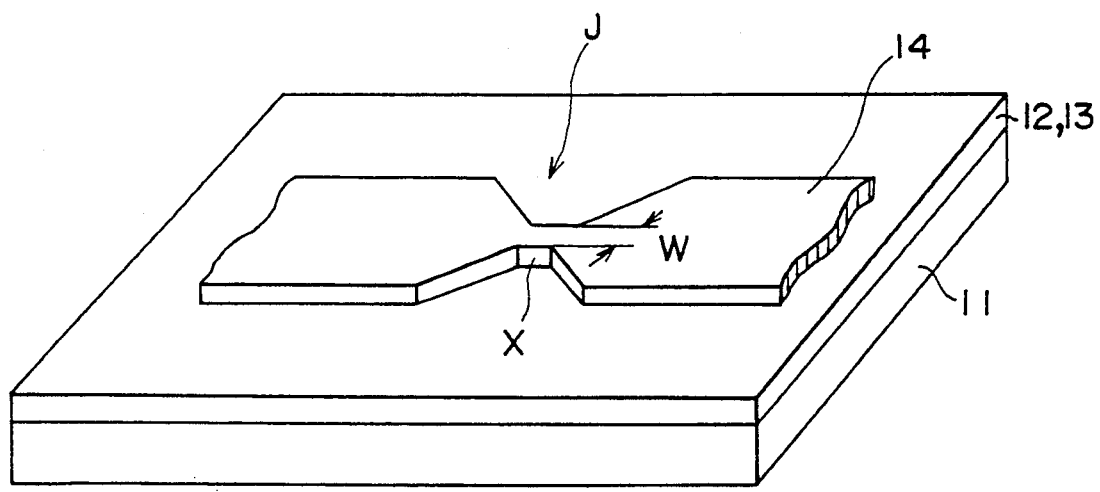
FIG. 2 is a diagram showing the active device formed in the process of the first embodiment.

Hereinafter, the present invention will be described about a first embodiment with reference to FIGS. 1(A)-1(D).

Referring to the drawings, a silicon substrate 11 having a (100) oriented upper surface is heated to a temperature of 570° C., and oxygen ions are implanted into the (100) surface with an energy of 150 keV and a dose of $1.7 \times 10^{18}$ cm$^{-2}$. In response to this ion implantation process, the oxygen ions are implanted at a depth of about 3000 Å from the surface of the substrate.

Next, a cap layer of silicon oxide (not shown) is formed on the upper surface of the substrate 11 by a CVD process with a thickness of about 3000 Å, and the substrate is annealed at 1200° C. for three hours in a nitrogen atmosphere. Thereby, the oxygen ions implanted into the substrate 11 are reacted with silicon forming the substrate and an oxide layer 12 is formed with a thickness of about 3000 Å. See FIG. 1(B). As the silicon oxide layer 12 is formed within the substrate 11, a silicon layer 13a is formed on the silicon oxide layer 12 in correspondence to the region where the oxygen ions have passed through at the time of ion implantation. There, the silicon layer 13a retains the original crystal structure of the single crystal silicon substrate 11. After the formation of the silicon oxide layer 12 and hence the silicon layer 13a, the silicon oxide cap layer is removed and the structure shown in FIG. 1(B) is obtained. The process described so far is known as the SIMOX process.

Next, the semiconductor body thus obtained in the step of FIG. 1(B) is incorporated into an evacuated reaction chamber and deposition of yttrium, barium and copper is started in an oxygen plasma environment. In this process, the substrate 11 is held at 520° C., and the reaction chamber is evacuated at the pressure of $1 \times 10^{-2}$ Pa. In response to the commencement of deposition, a thin layer 14a of high temperature superconductor is formed on the exposed upper surface of the silicon layer 13a as shown in FIG. 1(C).

It should be noted that the silicon layer 13a retains the original crystal structure of silicon substrate 11 at the exposed upper surface, and the superconductor layer 14a is formed in the silicon layer 13a with an epitaxial relationship with respect to the underlying silicon layer 13a and hence with respect to the silicon substrate 11. The superconductor layer thus formed has a composition of $YBa_2Cu_3O_{7-x}$.

After the superconductor layer 14a is formed, the foregoing deposition of Y, Ba and Cu under the oxygen plasma environment is continued with the deposition rate of about 0.2 $\mu$m/hour, until a layer 14 of the same composition as the layer 14a is formed with a thickness of about 0.3 $\mu$m. See FIG. 1(D). The superconductor layer 14 thus formed typically shows the critical temperature of 63° K.

It should be noted that, during the foregoing process of forming the structure of FIG. 1(D), the silicon layer 13a that is located under the layer 14, is oxidized. This layer 13a now converted to the silicon oxide layer is shown in FIG. 1(D) as a layer 13. It should be noted that the silicon layer 13 has a thickness of only about 0.2 $\mu$m and is oxidized completely during the process of epitaxial growth of the superconductor layer 14.

Next, the layer 14 is subjected to a patterning process that may be achieved by the ion milling process, such that a desired interconnection pattern or strip is formed on the upper major surface of the insulator layers 12 and 13. In the structure of FIG. 1(D), the distinction between the silicon oxide layer 12 and the silicon oxide layer 13 disappears, and the layers 12 and 13 act as a single insulator layer.

FIG. 2 shows an example of a Josephson device J that is formed in a strip of the superconductor layer 14. It should be noted that the Josephson device J includes a part X where the width W of the superconductor strip is reduced. Typically, the width W is chosen to be about 0.7 $\mu$m or less. The concentration of current in such a reduced width region X causes a transition of the superconductor strip 14 into the normal conduction state and the device operates as a device characterized by a non-linear hysteresis. Such a Josephson device may be used for the SQUID magnetometers for detecting extremely feeble magnetic field. Of course, the number of such Josephson devices is not limited to one, but a number of Josephson devices may be provided on the insulator layer 12, 13, with interconnection by the interconnection strips of the superconductor layer 14.

In the structure of FIG. 1(D) or FIG. 2, it should be noted that a thick insulator layer is formed under the superconductor layer 14. Thereby, the short circuit caused by pinholes formed in the insulator layer is positively prevented. Further, the parasitic capacitance under the superconductor layer 14 is reduced with the increased thickness of the insulator layer.

This point should be compared with a structure wherein the oxide superconductor layer 14 is formed directly on the surface of the silicon substrate under the oxygen plasma environment, without using the SIMOX technique. In such a case, the thickness of the silicon oxide layer formed under the superconductor layer 14 is too thin to provide reliable device operation. Further, the parasitic capacitance becomes too large in such a structure. In fact, this is the reason why the applicant of the present invention has started the research for the process of the present invention.

One may think that the structure identical with FIG. 1(D) may be formed by bonding a silicon single crystal layer on a silicon substrate on which an oxide layer is formed, as commonly practiced in the fabrication of SOI devices. When this method is adopted, however, the thickness of the silicon layer 13 tends to be too thick for conversion to the oxide layer at the time of epitaxial growth of the superconductor layer 14. Thus, in order to form the structure identical with the structure of FIG. 1(D), it is necessary to reduce the thickness of the silicon layer 13 to the thickness of about 0.2 μm, by polishing the layer 13 uniformly. However, such a process is not easy and is time consuming. Further, the structure fabricated as such is generally characterized by the crystal orientation of the superconductor layer 14 not aligning with the crystal orientation of the silicon substrate 11, contrary to the present invention. In the present invention, the crystal orientation of the layer 14 is aligned with respect to the crystal orientation of the silicon substrate 11, as the layer 14 is grown epitaxially on the silicon layer 13a that forms a part of the substrate 11.

As shown in FIG. 1(D), the superconductor layer 14 is not limited to a single crystal layer but may include a number of domains 14b. The domains 14b may have a diameter of about 1 μm and separated with each other by a grain boundary that extends from the bottom surface of the layer 14 to the top surface of the layer 14. Thereby, each domain 14b is grown with the same crystal orientation with each other, maintaining the same crystallographic relationship with respect to the substrate 11. The domain structure shown in FIG. 1(D) does not cause serious problems in conducting the current, as the surface area of the grain boundary is limited and the current can pass through the impurities, if any, that are segregated at the grain boundary by tunneling.

Figure 3A:
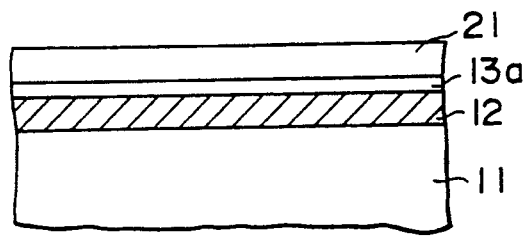
FIGS. 3(A)-3(C) are diagrams showing the process according to a second embodiment.
Figure 3B:
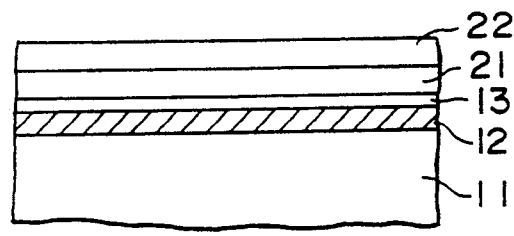
Figure 3C:
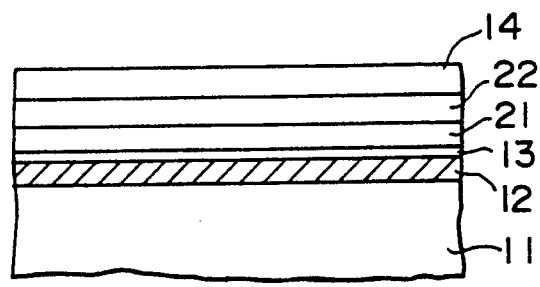

FIGS. 3(A)-3(C) show a second embodiment of the present invention.

Referring to FIG. 3(A), a spinel (MgAlO$_4$) layer 21 is grown on the silicon layer 13a of the structure of FIG. 1(B) epitaxially, with a thickness of about 0.2 μm as shown in FIG. 3(A). Further, a MgO layer 22 is grown on the spinel layer 21 epitaxially with a thickness of 0.2 μm. See FIG. 3(B). Further, the high temperature superconductor layer 14 of the composition YBa$_2$Cu$_3$O$_{7-x}$ is grown on the MgO layer by depositing Y, Ba and Cu in the oxygen plasma environment as described previously, with a thickness of 0.3 μm. The critical temperature of the layer 14 thus obtained is about 60° K.

Further, the present invention is not limited to the embodiments described heretofore, but various variations and modifications may be made without departing from the scope of the invention.

I claim:

1. A method for fabricating an active device, comprising the steps of:
   injecting particles into a surface of a single crystal substrate of a semiconductor material;
   annealing the substrate that contains the particles to form an amorphous oxide insulator layer within the substrate, generally in correspondence to a depth of said injected particles, said step of annealing including a step of forming a single crystal semiconductor layer of a semiconductor material identical in composition and crystal orientation with the semiconductor material of the substrate, on the amorphous oxide insulator layer that is formed by the annealing;
   growing the oxide super conductor layer on said semiconductor layer while maintaining an epitaxial relationship with respect to the substrate; and
   converting the semiconductor layer to an oxide layer simultaneously to the growth of the oxide superconductor layer.

2. A method as claimed in claim 1 in which said substrate comprises silicon and said particle comprises oxygen.

3. A method as claimed in claim 1 in which said insulator layer has a thickness of about 0.3 μm.

4. A method as claimed in claim 1 in which said semiconductor layer has a thickness of about 0.2 μm.

5. A method as claimed in claim 1 in which said steps of deposition and growth of the oxide superconductor layer are achieved in an oxygen plasma environment.

6. A method as claimed in claim 5 in which said steps of deposition and growth of the oxide superconductor layer comprise simultaneous deposition of yttrium, barium and copper in the oxygen plasma environment.

7. A method as claimed in claim 6 in which said oxide superconductor layer formed by the steps of deposition and growth has a composition of YBa$_2$Cu$_3$O$_{7-x}$.

8. A method as claimed in claim 1 further comprising the step of patterning the oxide superconductor layer to form an active device on the oxide layer.

9. A method as claimed in claim 8 in which said active device comprises a Josephson device.

10. A method as claimed in claim 8 in which said step of patterning comprises an ion milling process.

* * * * *

UNITED STATES PATENT AND TRADEMARK OFFICE
CERTIFICATE OF CORRECTION

PATENT NO. : 5,231,077
DATED : July 27, 1993
INVENTOR(S) : Nobuo SASAKI

It is certified that error appears in the above-indentified patent and that said Letters Patent is hereby corrected as shown below:

On the title page, Item [73], "Nobuo Sasaki, Kanagawa, Japan" should be --Fujitsu Limited, Kawasaki, Japan--.

Signed and Sealed this

Thirteenth Day of September, 1994

Attest:

BRUCE LEHMAN

Attesting Officer      Commissioner of Patents and Trademarks